United States Patent [19]

Takizawa et al.

[11] Patent Number: 4,768,070
[45] Date of Patent: Aug. 30, 1988

[54] OPTOELECTRONICS DEVICE

[75] Inventors: Yasushi Takizawa; Atsushi Sasayama, both of Komoro; Yoshihiko Kobayashi, Tateshina; Yukio Takahashi; Yuuji Kakegawa, both of Komoro, all of Japan

[73] Assignees: Hitachi, Ltd, Tokyo; Hitachi Tobu Semiconductor, Ltd., Saitama, both of Japan

[21] Appl. No.: 15,716

[22] Filed: Feb. 17, 1987

[30] Foreign Application Priority Data

Mar. 20, 1986 [JP]  Japan .................................. 61-60582
Mar. 20, 1986 [JP]  Japan .................................. 61-60583

[51] Int. Cl.$^4$ ........................................... H01L 31/12
[52] U.S. Cl. ..................................... 357/17; 350/96.2; 357/19; 357/36; 357/87; 372/36; 372/75
[58] Field of Search ................ 357/17, 19, 74, 81; 350/96.2; 372/36, 87, 75

[56] References Cited

U.S. PATENT DOCUMENTS

| Re. 27,879 | 1/1974 | Collins et al. | 357/17 X |
|---|---|---|---|
| 3,562,404 | 2/1971 | Satriano | 357/81 X |
| 4,119,363 | 10/1978 | Camlibel et al. | 357/17 X |
| 4,270,134 | 5/1981 | Takeda et al. | 357/81 X |
| 4,296,998 | 10/1981 | Dufft | 357/17 X |
| 4,338,577 | 7/1982 | Sato et al. | 357/19 X |
| 4,351,051 | 9/1982 | Alem et al. | 357/81 X |
| 4,632,504 | 12/1986 | Thillays | 357/17 X |
| 4,659,170 | 4/1987 | Wittke | 357/17 X |
| 4,686,678 | 8/1987 | Ohta et al. | 357/74 X |

Primary Examiner—R. R. Kucia
Attorney, Agent, or Firm—Antonelli, Terry & Wands

[57] ABSTRACT

An optoelectronics device wherein a light-receiving element which defines a monitor light receiver and a semiconductor laser which generates a laser beam are hermetically sealed in the same package, and wherein the light-receiving surface of the element for measuring the output power of the beam of light emitted from the semiconductor laser is disposed so as to be inclined with respect to the light-emitting surface of the semiconductor laser. The wire bonding surface of the light-receiving element pellet-bonded to a stem and the wire bonding surface of the lead electrically connected to the light-receiving element through a wire are arranged so as to be parallel with each other. Thus, it is possible to support both the bonding surfaces horizontally at the same time. As a result, a bonding tool can be brought into perpendicular contact with each of the bonding surfaces, and this enables appropriate wire bonding to be effected.

20 Claims, 8 Drawing Sheets

OPTOELECTRONICS DEVICE

BACKGROUND OF THE INVENTION

The present invention relates to an optoelectronics device and a method of producing the same. More particularly, the present invention pertains to a technique for electrically connecting together a light-receiving element and a lead which serves as an output terminal of the element, for example, a technique which may effectively be utilized for a semiconductor laser device having an auto power control (APC) function and a method of producing such laser device.

Semiconductor laser devices of various structures have been developed for being utilized as light sources for optical communication and light sources for information processing devices such as digital audio disks and video disks. For example, semiconductor laser devices such as those described in the Sept. 14, 1981, issue of "Nikkei Electronics," Nikkei McGraw-Hill, pp. 138 to 152 are known as light sources for information processing devices such as digital audio disks and video disks.

This type of semiconductor laser device is generally arranged such that a semiconductor laser element (laser chip) is rigidly secured through a submount to a heat sink provided at the center of the principal surface of a stem, and the intensity of the laser beam is monitored by a light-receiving element which is mounted on the principal surface of the stem. The laser beam which is to be actually used is emitted to the outside of the package from a window which is provided in the ceiling of a cap mounted on the principal surface of the stem, the window having a transparent member put therein.

When a semiconductor laser device is applied to a light source for an information processing device or a light transmitter, an appropriate bias is applied to the semiconductor laser to drive the laser at a level and an amplitude which are conformable with an electric signal which is input thereto from a previous stage, thereby generating an optical output corresponding to the input electric signal. Another important function in such operation is auto power control (APC) which prevents variations in the current value at which the semiconductor laser is desired to oscillate which variations would otherwise be caused by changes in temperature and changes with passage of time, thereby allowing a constant optical output to be generated. APC is generally effected in such a manner that a part of the laser beam emitted from the semiconductor laser is received by a monitor light receiver, and the output of the light receiver is compared with a preset reference value to obtain a signal indicating a difference therebetween which is then employed to feedback-control the bias current and the signal current.

Semiconductor laser devices of the type having such APC function involve the concern that the far field pattern may be disordered by the laser beam which is reflected from the light-receiving surface of the light-receiving element to emerge from the window in the cap. In order to prevent such disorder of the far field pattern, there has been developed a technique in which the light-receiving element is slantingly secured to the stem so that any laser beam which is reflected from the light-receiving surface will not reach the window in the cap. This technique is described in the specification of Japanese Patent Laid-Open No. 148483/1980.

SUMMARY OF THE INVENTION

The present inventors examined semiconductor laser devices having the structure in which light-receiving elements are slantingly disposed, and have found that, since the wire bonding surface of a light-receiving element chip is slanted at a predetermined angle with respect to the wire bonding surface of a lead serving as an output terminal which is to be electrically connected through a wire to the wire bonding surface of the chip, the conventional semiconductor laser devices suffer from the following problems.

(1) A bonding tool which moves vertically comes into contact with the wire bonding surface of the light-receiving element chip obliquely rather than perpendicularly to the plane of the chip, and this leads to inappropriate wire bonding.

(2) When the wire bonding apparatus is so designed that the bonding tool perpendicularly comes into contact with both the bonding surfaces of the light-receiving element chip and the lead, the bonding stage must be arranged so that the angle of the stage is variable, which means that the structure of the wire bonding apparatus is complicated. In addition, the time required for the wire bonding operation is extended to lower the productivity.

It is an object of the present invention to provide an optoelectronics device which is designed to enable appropriate and highly reliable wire bonding to be effected while suppressing lowering of the productivity in assembly of products.

It is another object of the present invention to provide a method of producing an optoelectronics device which enables a highly efficient manufacturing operation to be carried out.

The above and other objects and novel features and advantages of the present invention will become more apparent from the following description taken in conjunction with the accompanying drawings.

A representative one of the novel techniques disclosed in this application will briefly be explained below.

In an optoelectronics device, the wire bonding surface of a light-receiving element and the wire bonding surface of a lead which is electrically connected to the light-receiving element by a wire are disposed in parallel relation to each other.

By virtue of the above-described means, since the wire bonding surface of the lead and that of the light-receiving element are parallel to each other, both the bonding surfaces can be supported horizontally at the same time by tilting the stem. As a result, the bonding tool can be brought into perpendicular contact with both the bonding surfaces, and this enables appropriate wire bonding.

DESCRIPTION OF THE PREFERRED EMBODIMENTS

[Embodiment I]

Figures 1A, 1B:
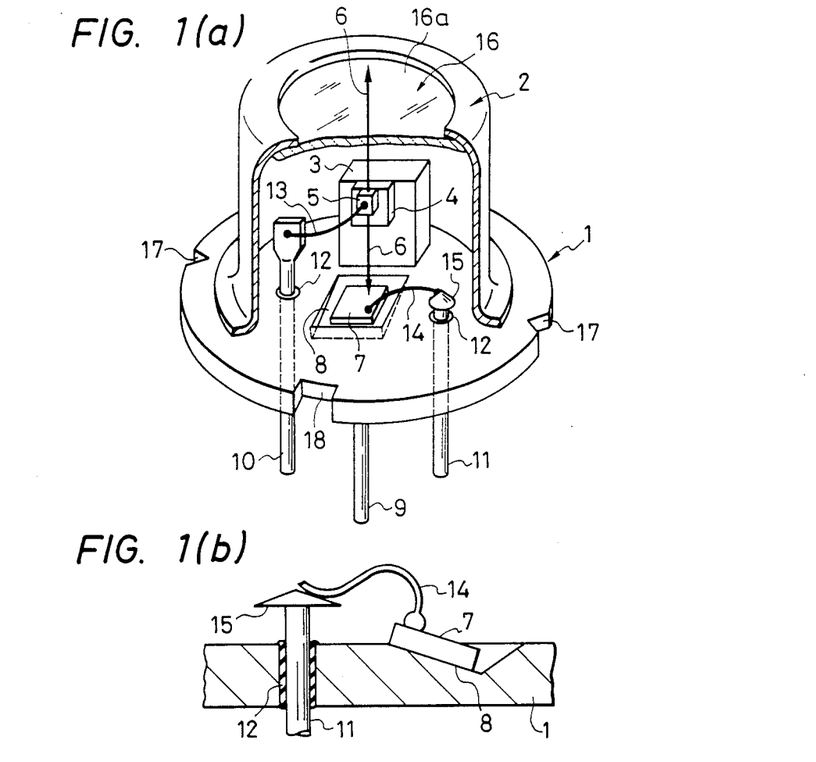
FIG. 1(a) is a partially-cutaway perspective view of a semiconductor laser device in accordance with one embodiment of the present invention.
FIG. 1(b) is an enlarged schematic view of an essential part of the device shown in FIG. 1(a)
Figure 2:
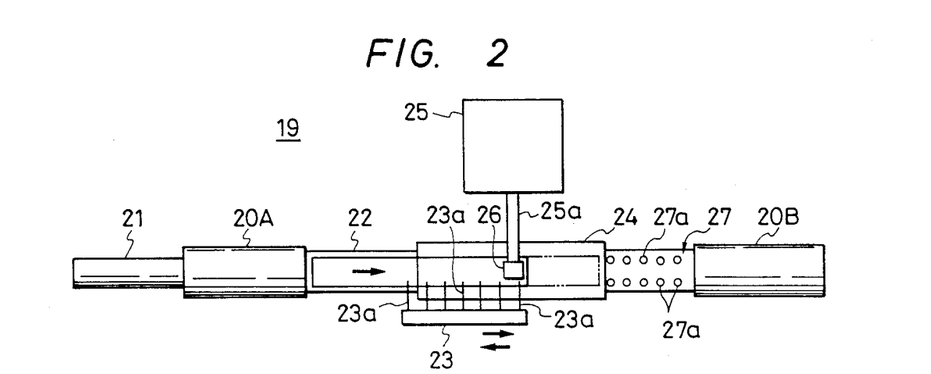
FIG. 2 is a schematic plan view of an apparatus used to carry out a wire bonding operation for the device shown in FIG. 1(a)
Figure 3:
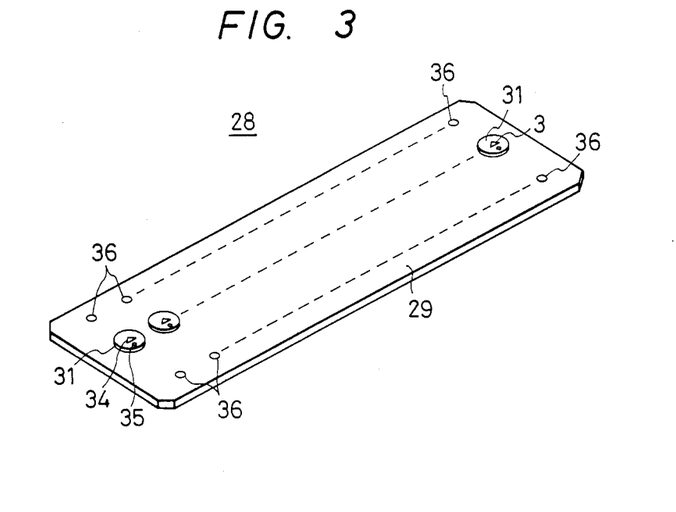
FIG. 3 is a perspective view of a support jig used in the wire bonding operation.
Figure 4:
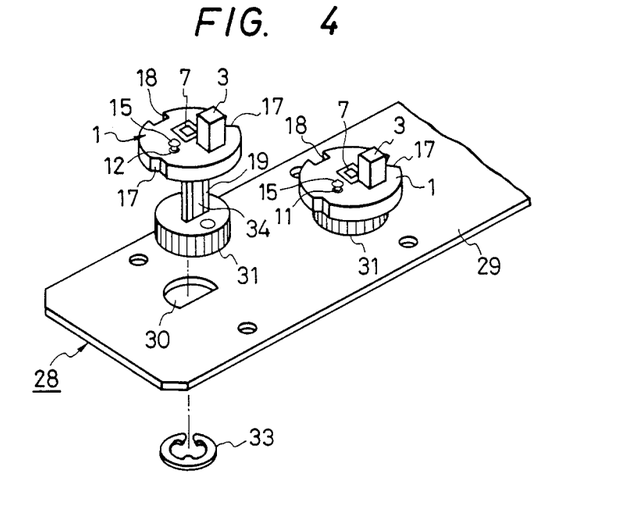
FIG. 4 is an exploded perspective view of an essential part of the support jig shown in FIG. 3.
Figure 5:
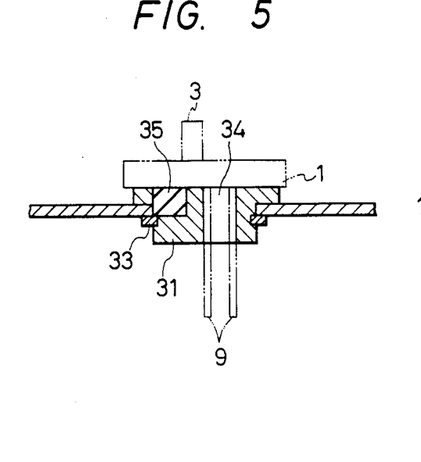
FIG. 5 is an enlarged fragmentary sectional view of the support jig.
Figure 6:
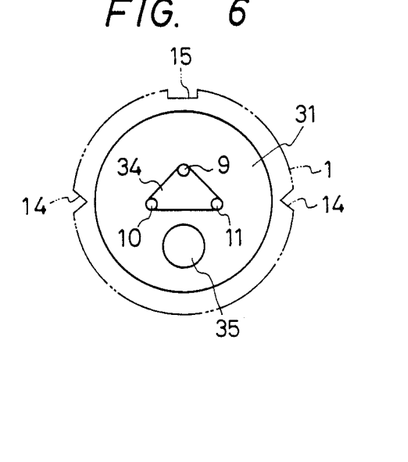
FIG. 6 is a conceptional plan view showing the positional relationship between the support jig and the stem.
Figure 7:
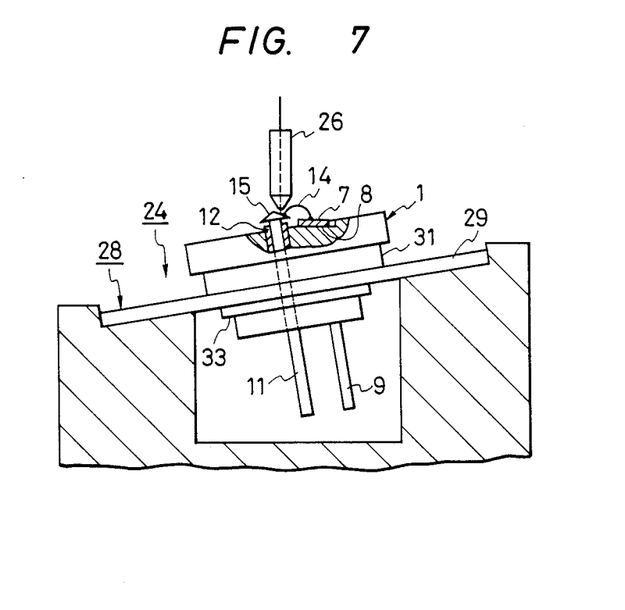
FIG. 7 is a fragmentary side view showing a wire bonding operation.

FIG. 1(a) is a partially-cutaway perspective view of a semiconductor laser device in accordance with one embodiment of the present invention; FIG. 1(b) is an enlarged schematic view of an essential part of the device shown in FIG. 1(a); FIG. 2 is a schematic plan view of a wire bonding apparatus used to carry out a wire bonding operation for the device shown in FIG. 1(a); FIG. 3 is a perspective view of a support jig used in the wire bonding operation; FIG. 4 is an exploded perspective view of an essential part of the support jig shown in FIG. 3; FIG. 5 is an enlarged fragmentary sectional view of the support jig; FIG. 6 is a conceptional plan view showing the positional relationship between the support jig and the stem; and FIG. 7 is a fragmentary side view showing a wire bonding operation.

In this embodiment, the present invention is exemplarily applied to a semiconductor laser device which serves as a light source for a compact disk system. Referring first to FIGS. 1(a) and 1(b), the semiconductor laser device has a plate-like stem 1 and a cap 2 which is hermetically secured to the principal surface of the stem 1, the stem 1 and the cap 2 defining main components of the assembly. The stem 1 is constituted by a disk-shaped metal plate having a thickness of several millimeters. A heat sink 3 made of copper is rigidly secured to the center of the principal (upper) surface of the stem 1 by means, for example, of a brazing material. A semiconductor laser element (laser chip) 5 is rigidly secured to one side surface of the heat sink 3 through a submount 4. The laser chip 5 has, for example, a width of 400 $\mu$m, a length of about 300 $\mu$m and a height of 100 $\mu$m, and a resonator which emits a laser beam 6 is positioned at a depth of about 3 to 5 $\mu$m from the surface of the laser chip 5.

On the other hand, a light-receiving element 7 is rigidly secured to the principal surface of the stem 1, the element 7 being adapted to receive the laser beam 6 emitted from the lower end of the laser chip 5 in order to monitor the power of the laser beam 6.

The light-receiving element 7 defines a monitor light receiver which receives a part of the laser beam generated from the semiconductor laser chip 5. The monitor light receiver constitutes an auto power control (APC) mechanism of the type wherein the laser beam 6 is received by the light-receiving element 7, and the output of the element 7 is compared with a preset reference value to obtain a signal indicating a difference therebetween which is then employed to feedback-control the bias current and the signal current. Thus, this APC mechanism prevention variations in the current value at which the semiconductor laser is desired to oscillate which variations would otherwise be caused by changes in temperature and changes with passage of time, and thereby maintains the optical output at a constant level.

The light-receiving element 7 is rigidly secured through a bonding material (not shown) to a slant surface which is provided on the principal surface of the stem 1 by means of coining, e.g., a slant surface 8 having an angle of 7 degrees with respect to the principal surface of the stem 1. The reason why the light-receiving surface of the element 7 for measuring the power of the emergent laser beam is inclined with respect to the emergent surface of the laser chip 5 is that any laser beam 6 which is emitted from the laser chip 5 and undesirably reflected from the light-receiving surface of the element 7 must be prevented from emerging from a window 16 provided in the cap 2 (described later) in order to avoid an accident by the harmful laser beam, thereby preventing disorder of the far field pattern.

Three leads 9, 10 and 11 are rigidly secured to the stem 1. One lead 9 is mechanically connected to the reverse surface of the stem 1 so that the lead 9 is electrically conductive to the stem 1, while the other two leads 10 and 11 extend through the stem 1 and are mechanically secured to the stem 1 through glass 12 which serves as a sealing material having insulating properties in such a manner that the leads 10 and 11 are electrically insulated from the stem 1. The upper end portions of the two leads 10 and 11 which project from the principal surface of the stem 1 are connected to respective electrodes of the laser chip 5 and the light-receiving element 7 through wires 13 and 14 by means of wire bonding.

In this embodiment, a conical portion 15 which has the shape of an unfolded umbrella is formed integral with the distal end of the lead 11 which is electrically connected to the light-receiving element 7. The vertex angle of the conical portion 15 is so set that the slant surface thereof is parallel with the slant surface of the light-receiving element 7. The conical portion 15 may be formed in such a manner that, after a round rod material has been cut to form a lead 11, the distal end portion of the lead 11 is pressed against a conical female die relative to each other, thereby forming the conical portion 15 integral with the lead 11. Then, one end portion of the wire 14 is bonded onto the slant surface of the conical portion 15 by a wire bonding operation such as that described later.

The metallic cap 2 having the window 16 is hermetically secured to the principal surface of the stem 1, so that the cap 1 hermetically seals the laser chip 5, the heat sink 3 and the light-receiving element 7. The window 16 is defined by a circular bore provided in the ceiling of the cap 2, the bore being hermetically closed with a transparent glass plate 16a. Accordingly, the laser beam 6 which emerges from the upper end of the laser chip 5 is transmitted by the transparent glass plate 16a and radiated to the outside of a package which is defined by a combination of the stem 1 and the cap 2.

A pair of opposing V-shaped notches 17 and a rectangular notch 18 are provided in the outer peripheral portion of the stem 1 so as to be used for positioning during assembly and as transport guides.

If the distal end surface of a lead which is to be connected to the light-receiving element is formed so as to be perpendicular to the longitudinal axis of the lead, when a wire is bonded to the lead and the element, the position or posture of the stem needs to be changed. Since the light-receiving element is slanted at an angle of 7 degrees with respect to the principal surface of the stem, if the posture of the stem is not changed, the bonding tool which moves vertically cannot come into perpendicular contact with the bonding surface of the light-receiving element, which means that appropriate bonding cannot be effected. For this reason, when one end portion of a wire is to be bonded to the light-receiving element, the principal surface of the stem needs to be tilted at 7°, whereas, when the other end portion of the wire is to be bonded to the lead, it is necessary to return the stem to the previous horizontal position.

The necessity of changing the posture of the stem undesirably complicates the structure of the mechanism of the wire bonding apparatus and lowers the operability as well as the quality and reliability of bonding, resulting in lowering of the production efficiency. More specifically, the structure for changing the position of the bonding stage during the movement of the bonding tool from the first bonding portion to the second bonding portion becomes complicated in relation to, for example, the bonding mechanism and further involves problems such as a delay in the bonding operation. If the position of the bonding stage is changed during the movement of the bonding tool from the first bonding portion to the second bonding portion, the wire having one end already rigidly connected to the first bonding portion is twisted, and this leads to degradation of the quality and reliability of bonding.

However, in this embodiment, the conical portion 15 is formed at the distal end of the lead 11, and the wire 14 is secondarily bonded to the slant surface of the conical portion 15, which means that the posture of the stem 1 need not be changed. As a result, it is possible to effect appropriate bonding while improving the productivity.

The following is a description of a wire bonding operation carried out for the light-receiving element 7 and the lead 11 in accordance with this embodiment.

A wire bonding apparatus 19 which is used in this operation is arranged as shown in FIG. 2. More specifically, the apparatus 19 performs wire bonding with respect to support jigs (described later) which are sent out one by one from a full cartridge 20A in a loader section to a transport passage 22 by the action of a pusher 21. A support jig fed onto the transport passage 22 is caught by a plurality of nibs 23a provided on a transport mechanism 23 and thereby intermittently transported on the stage 24, on which wire bonding is effected with respect to all the stems 1 which are fitted in each support jig at equal distances. The wire bonding is carried out by a wire bonding mechanism 25 which is disposed so that a bonding tool 26 attached to the distal end of an arm 25a faces the upper side of the stage 24. A support jig having all the stems 1 subjected to wire bonding is transported onto an unloading transport passage 27 by the transport mechanism 23. A plurality of rows of air jet bores 27a are disposed in the unloading transport passage 27 so as to define an air bearing which pneumatically sends the support jig into an empty cartridge 20B in an unloading section.

The stage 24 and the transport passages 22, 27 are laid at an angle of 7 degrees with respect to the horizontal plane so that the respective slant surfaces of the light-receiving element 7 and the conical portion 15 are horizontal. However, the transport passages 22 and 27 may be laid horizontally and the stage 24 alone may be inclined at 7° with respect to the horizontal plane.

As shown in FIGS. 3 and 4, the support jig 28 has a strip-shaped metallic frame 29 and retainers 31 which are respectively inserted into a row of mounting bores 30 provided along the center of the frame 29 at equal distances. Each retainer 31 has a substantially stepped disk-like configuration, and a lower small-diameter portion 32 is inserted into one of the mounting bores 30. Each bore 30 has a semicircular cross-section, and the small-diameter portion 32 has a cross-sectional configuration corresponding to that of the bore 30. Accordingly, the small-diameter portion 32 which is inserted into the mounting bore 30 is prevented from rotating, thereby allowing the retainer 31 to be positioned with a high degree of accuracy. An E-shaped stop ring 33 is attached to the small-diameter portion 32 projecting downward from the mounting bore 30, thus rigidly securing the retainer 31 to the frame 29.

Further, an accommodating portion 34 having a triangular cross-section is provided on the retainer 31. The accommodating portion 34 is disposed so as to correspond to the arrangement of the three leads 9, 10 and 11 as shown in FIG. 6. Accordingly, when the three leads of the stem 1 are inserted into the accommodating portion 34, the leads 9, 10 and 11 are respectively positioned at the vertexes of the triangular accommodating portion 34, which means that the stem 1 is highly precisely positioned with respect to the retainer 31 and hence the frame 29. The reproducibility of this positioning operation is favorably high. A permanent magnet 35, for example, a rare earth permanent magnet which is small in size and still has a relatively large magnetic force, is fitted in the vicinity of the accommodating portion 34 of the retainer 31. Accordingly, the stem 1, which has the leads 9, 10 and 11 inserted into the accommodating portion 34 and whose reverse surface is mounted on the retainer 31, is rigidly secured to the retainer 31 by means of the magnetic force from the permanent magnet 35. The magnetic force of the permanent magnet 35 is set to be so strong that, even when the stem 1 is positioned in such a manner that the plane thereof extends vertically, there is no fear of the position of the stem 1 changing with respect to the retainer 31, or there is no risk of the stem 1 coming off the retainer 31. Further, the stem 1, which is rigidly secured to the retainer 31 by means of the magnetic force from the permanent magnet 35, can readily be drawn out either a manual or automatic operation without any damage to the stem 1 and the like.

It should be noted that two rows of guide bores 36 are provided along two lateral edge portions of the frame 29 in such a manner that the guide bores 36 correspond to the mounting bores 30. The guide bores 36 are employed to feed and position the support jig 28 when it is moved on the transport passages 22, 27 and the stage 24 in the wire bonding apparatus.

Semiconductor devices which are to be subjected to a wire bonding operation are, as shown in FIG. 4, set on a support jig 28 in a state wherein caps 2 have not yet been mounted on the devices, and the support jig 28 is accommodated in the full cartridge 20A in the loader section. Support jigs 28 which are sent out one by one from the full cartridge 20A by the action of the pusher 21 is intermittently moved on the stage 24 by the operation of the transport mechanism 23.

Since the stage 24 is inclined at a predetermined angle, both the upper surface of the light-receiving element 7 and a part of the conical surface of the conical portion 15 of the lead 11 on the stem 1 which is set on the support jig 28 are held horizontally on the stage 24 as shown in FIG. 7.

Since the lead 11 is sealably connected to the stem 1 by means of the glass 12 which serves as a sealing material, it is difficult to restrict its circumferential position to a predetermined one. However, since the slant surface of the lead 11 is defined by the conical portion 15, when the stem 1 is tilted, a horizontal plane inevitably appears on the conical portion 15 independently of the circumferential position of the lead 11.

In this way, first and second bonding operations are successively carried out with respect to the upper surface of the light-receiving element 7 held horizontally and a part of the conical surface of the lead 11 which is also held horizontally. In this bonding operation, the bonding tool 26 comes into perpendicular contact with each of the first bonding surface of the light-receiving element 7 and the second bonding surface of the lead 11, thereby allowing appropriate bonding to be effected on both the first and second bonding surfaces. Since the distal end portion 15 of the lead 11 which defines the second bonding surface is formed in the shape of an unfolded umbrella, a sufficiently wide bonding surface is ensured, so that bonding can be effected appropriately.

When all the stems 1 set on the support jig 28 have been subjected to wire bonding, the jig 28 is moved to the unloading transport passage 27 by the action of the transport mechanism 23 and is then sent into the empty cartridge 20B.

On the other hand, the operation of bonding the wire 13 which connects together the laser chip 5 and the lead 10 is carried out in a state wherein the support jig 28 is disposed vertically. More specifically, when the support jig 28 is placed horizontally, the first bonding surface of the laser chip 5 and the second bonding surface of the lead 10 are horizontal, and it is therefore possible to ensure a bonding condition which is appropriate to both the first and second bonding surfaces. At this time, the stem 1 is disposed in such a manner that the plane thereof extends vertically. However, since the stem 1 is reliably held on the support jig 28 by the action of the permanent magnet 35, there is no fear of the stem 1 coming off the jig 28 or moving loosely.

The operation of bonding the wire 13 for connecting the laser chip 5 and the lead 10 may be carried out either before or after the operation of bonding the wire 14 which connects together the light-receiving element 7 and the lead 11. In this case, it is preferable to arrange the wire bonding apparatus such that two combinations of a stage and a bonding mechanism for bonding the wires 13 and 14, respectively, are installed adjacent to each other so as to enable each support jig to be loaded and unloaded in a single operation.

The above-described embodiment offers the following advantages.

(1) A conical portion is formed at the distal end of a lead so that the wire bonding surface of the lead and the wire bonding surface of the light-receiving element are parallel with each other. Accordingly, it is possible to place both the bonding surfaces horizontally at the same time by appropriately tilting the stem, and therefore the bonding tool which moves vertically can be brought into perpendicular contact with each of the bonding surfaces. As a result, both the bonding surfaces can be subjected to appropriate wire bonding.

(2) Placing both the bonding surfaces horizontally at the same time eliminates the need to tilt the bonding stage during the movement of the bonding tool from the first bonding position to the second bonding position, which means that it is possible to suppress complication of the mechanism of the wire bonding apparatus. In addition, it is possible to prevent lowering of the operability in wire bonding and avoid twisting of the wire. As a result, lowering of productivity can be prevented.

(3) By forming a conical portion at the distal end of a lead, a part of the conical wire bonding surface of the lead is inevitably parallel with the wire bonding surface of the light-receiving element. Therefore, both the bonding surfaces can be made horizontal and realize glass sealing of the lead without restricting the circumferential position of the lead.

(4) By forming the conical portion of the lead so as to have the shape of an unfolded umbrella, the wire bonding surface which is defined by the conical surface can be enlarged, so that it is possible to further ensure an appropriate bonding condition.

Although the invention accomplished by the present inventors has practically been described by way of one embodiment, the present invention is not necessarily limited to the described embodiment and various changes and modifications may, of course, be imparted thereto without departing from the scope and spirit of the invention.

Figure 8:
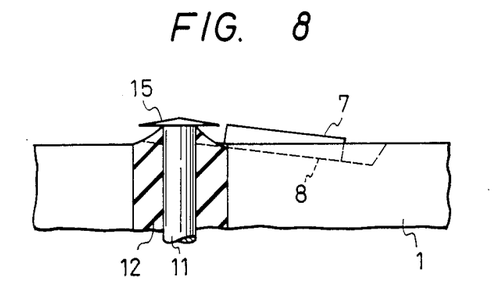
FIG. 8 is a partially-sectioned side view of a modification of the present invention.

For example, as shown in FIG. 8, the lead 11 may be rigidly secured to the stem 1 in such a manner that the lead sealing glass 12 is disposed as far as the root of the conical portion 15 provided at the distal end of the lead 11. This arrangement enables an improvement in the strength of the lead 11 required during the wire bonding operation, thus allowing excellent wire bonding.

Figure 9:
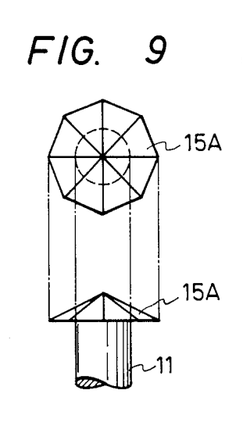
FIG. 9 shows another example of the conical portion in plan and side views.
Figure 10:
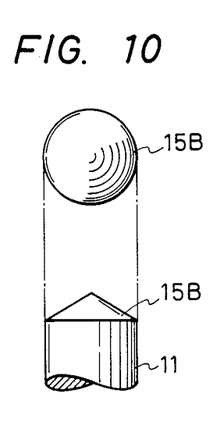
FIG. 10 shows still another example of the conical portion in plan and side views.
Figure 11:
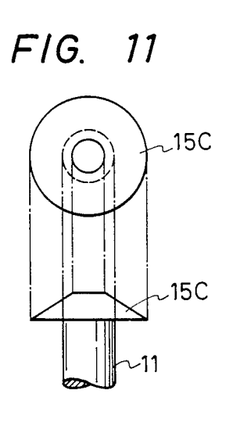
FIG. 11 shows a further example of the conical portion in plan and side views.

The configuration of the conical portion 15 is not necessarily limited to the shape of a circular cone and may be pyramidal as denoted by the reference numeral 15A in FIG. 9. Although the conical portion 15 in the described embodiment has the shape of an unfolded umbrella, it is also possible to employ a conical portion 15B whose maximum diameter is equal to the diameter of the lead as shown in FIG. 10, or a conical portion 15C which has a frusto-conical shape as shown in FIG.

11. It is also possible to employ a lead which has a frusto-conical portion at its distal end.

The wire bonding operation in which the stem is set on a support jig is not necessarily limitative, and the stem may be subjected to wire bonding alone without using a support jig.

There is, of course, no restriction on the type of wire bonding apparatus employed.

In addition, the leads 10 and 11 shown in FIG. 1 may be disposed in a reverse manner. Further, the rectangular notch 18, which is provided in the periphery of the stem 1, may be provided at a position to the rear of the heat sink 3. A projection for positioning the cap 2 may be formed on the surface of the stem 1 so that the cap 2 is fitted on the projection.

Although the invention accomplished by the present inventors has mainly been described above by way of example in which the invention is applied to a semiconductor laser device which is the background art of the invention, it is not necessarily limited to the semiconductor laser device and may widely be applied to general electronic devices having wire bonding surfaces which are inclined with respect to each other.

The following is a brief description of the advantage obtained by a representative one of the novel techniques disclosed in this application.

The wire bonding surface of a lead is formed so as to be parallel with that of a light-receiving element, whereby both the bonding surfaces can be placed horizontally at the same time. It is therefore possible to bring a bonding tool into perpendicular contact with each of the bonding surfaces, so that it is possible to effect bonding which is appropriate to both the bonding surfaces.

[Embodiment II]

Figure 12A:
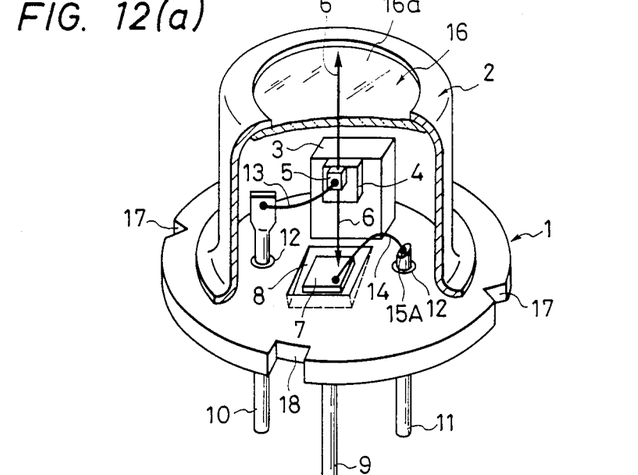
FIG. 12(a) is a partially-cutaway perspective view of a semiconductor laser device in accordance with another embodiment of the present invention.
Figure 12B:
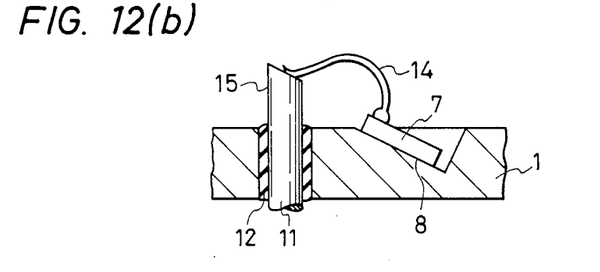
FIG. 12(b) is an enlarged schematic view of an essential part of the device shown in FIG. 12(a)
Figure 13:
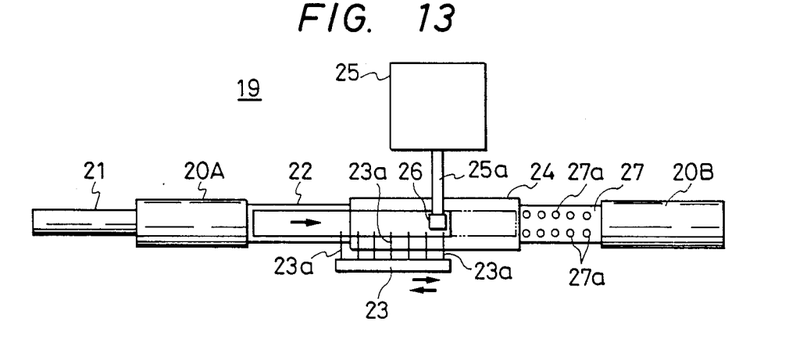
FIG. 13 is a schematic plan view of an apparatus used to carry out a wire bonding operation for the device shown in FIG. 12(a)
Figure 14:
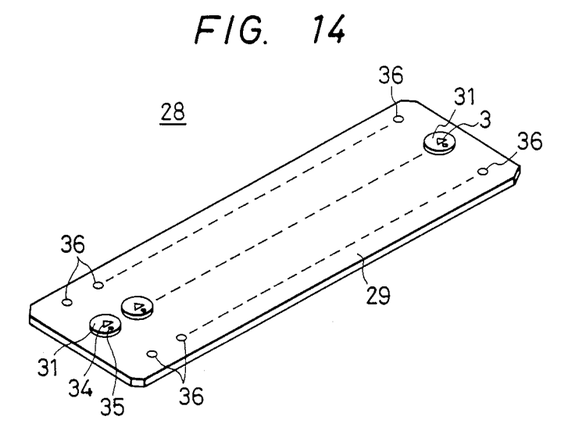
FIG. 14 is a perspective view of a support jig used in the wire bonding operation.
Figure 15:
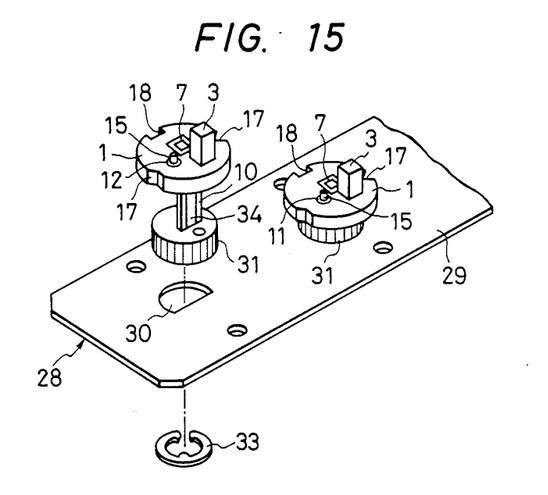
FIG. 15 is an exploded perspective view of an essential part of the support jig shown in FIG. 14.
Figure 16:
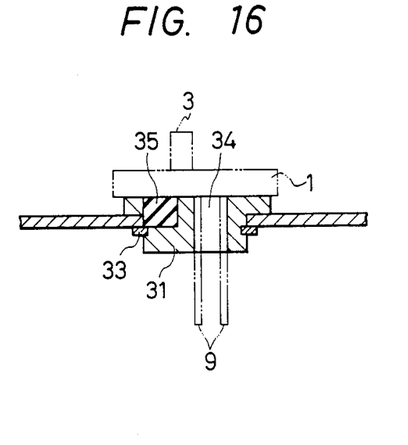
FIG. 16 is an enlarged fragmentary sectional view of the support jig.
Figure 17:
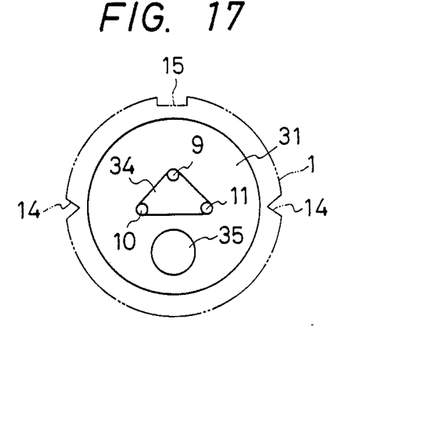
FIG. 17 is a conceptional plan view showing the positional relationship between the support jig and the stem.
Figure 18:
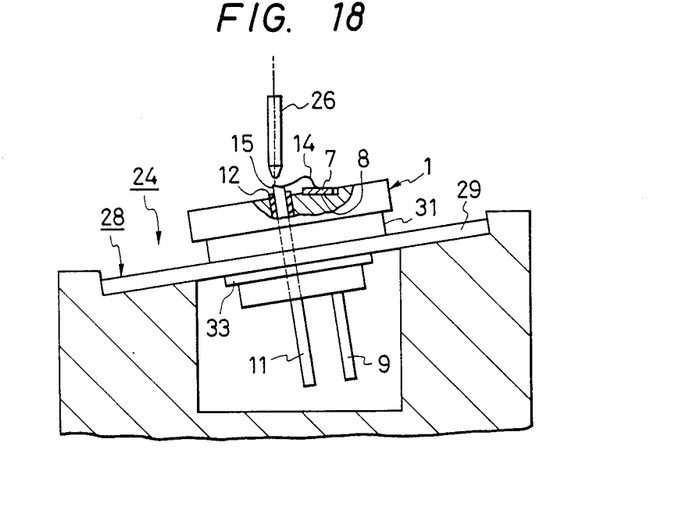
FIG. 18 is a fragmentary side view showing a wire bonding operation.

FIG. 12(a) is a partially-cutaway perspective view of a semiconductor laser device in accordance with another embodiment of the present invention; FIG. 12(b) is an enlarged schematic view of an essential part of the device shown in FIG. 12(a); FIG. 13 is a schematic plan view of an apparatus used to carry out a wire bonding operation for the device shown in FIG. 12(a); FIG. 14 is a perspective view of a support jig used in the wire bonding operation; FIG. 15 is an exploded perspective view of an essential part of the support jig shown in FIG. 14; FIG. 16 is an enlarged fragmentary sectional view of the support jig; FIG. 17 is a conceptional plan view showing the positional relationship between the support jig and the stem; and FIG. 18 is a fragmentary side view showing a wire bonding operation.

In this embodiment, the present invention is exemplarily applied to a semiconductor laser device which serves as a light source for a compact disk system. Referring first to FIGS. 12(a) and 12(b), the semiconductor laser device has a plate-like stem 1 and a cap 2 which is hermetically secured to the principal surface of the stem 1, the stem 1 and the cap 2 defining main components of the assembly. The stem 1 is constituted by a disk-shaped metal plate having a thickness of several millimeters. A heat sink 3 made of copper is rigidly secured to the center of the principal (upper) surface of the stem 1 by means, for example, of a brazing material. A semiconductor laser element (laser chip) 5 is rigidly secured to one side surface of the heat sink 3 through a submount 4. The laser chip 5 has, for example, a width of 400 μm, a length of 300 μm and a height of 100 μm, and a resonator which emits a laser beam 6 is positioned at a depth of about 3 to 5 μm from the surface of the laser chip 5.

On the other hand, a light-receiving element 7 is rigidly secured to the principal surface of the stem 1, the element 7 being adapted to receive the laser beam 6 emitted from the lower end of the laser chip 5 in order to monitor the power of the laser beam 6. The light-receiving element 7 is rigidly secured through a bonding material (not shown) to a slant surface which is provided on the principal surface of the stem 1 by means of coining, e.g., a slant surface 8 having an angle of 7 degrees with respect to the principal surface of the stem 1. The reason why the light-receiving element 7 is slanted is that any laser beam 6 which is emitted from the laser chip 5 and undesirably reflected from the light-receiving surface of the element 7 must be prevented from entering a window provided in the cap 2 (described later) in order to avoid disordering of the far field pattern.

Three leads 9, 10 and 11 are rigidly secured to the stem 1. One lead 9 is electrically and mechanically connected to the reverse surface of the stem 1, while the other two leads 10 and 11 extend through the stem 1 and are rigidly secured to the stem 1 through glass 12 which serves as a sealing material having insulating properties in such a manner that the leads 10 and 11 are electrically insulated from the stem 1. The upper end portions of the two leads 10 and 11 which project from the principal surface of the stem 1 are connected to respective electrodes of the laser chip 5 and the light-receiving element 7 through wires 13 and 14.

In this embodiment, a slant surface portion 15 is formed integral with the distal end of the lead 11 which is electrically connected to the light-receiving element 7. The vertex angle of the slant surface portion 15 is so set that the slant surface thereof is parallel with the slant surface of the light-receiving element 7. The slant surface portion 15 may be formed in such a manner that, when a round rod material is cut into a length of a lead, one end of the lead is cut at a predetermined angle with respect to the longitudinal axis of the lead, thereby forming the slant surface portion 15 integral with the lead 11, or the portion 15 is shaped by means of pressing. Then, one end portion of the wire 14 is bonded onto the slant surface portion 15 by a wire bonding operation such as that described later.

The metallic cap 2 having a window 16 is hermetically secuted to the principal surface of the stem 1, so that the cap 1 hermetically seals the laser chip 5 and the heat sink 3. The window 16 is defined by a circular bore provided in the ceiling of the cap 2, the bore being hermetically closed with a transparent glass plate 16a. Accordingly, the laser beam 6 which emerges from the upper end of the laser chip 5 is transmitted by the transparent glass plate 16a and radiated to the outside of a package which is defined by a combination of the stem 1 and the cap 2. A pair of opposing V-shaped notches 17 and a rectangular notch 18 are provided in the outer peripheral portion of the stem 1 so as to be used for positioning during assembly.

If the distal end surface of a lead which is to be connected to the light-receiving element is formed so as to be perpendicular to the longitudinal axis of the lead, when a wire is bonded to the lead and the element, the position or posture of the stem needs to be changed. Since the light-receiving element is slanted at an angle of 7 degrees with respect to the principal surface of the stem, if the posture of the stem is not changed, the bonding tool which moves vertically cannot come into perpendicular contact with the bonding surface of the light-receiving element, which means that appropriate bonding cannot be effected. For this reason, when one end portion of a wire is to be bonded to the light-receiving element, the principal surface of the stem needs to be tilted at 7°, whereas, when the other end portion of the wire is to be bonded to the lead, it is necessary to return the stem to the previous horizontal position.

The necessity of changing the posture of the stem undesirably complicates the structure of the wire bonding apparatus and lowers the operability as well as the quality and reliability of bonding, resulting in lowering of the productivity. More specifically, the structure for changing the position of the bonding stage during the movement of the bonding tool from the first bonding portion to the second bonding portion becomes complicated in relation to, for example, the bonding mechanism and further involves problems such as a delay in the bonding operation. If the position of the bonding stage is changed during the movement of the bonding tool from the first bonding portion to the second bonding portion, the wire having one end already rigidly connected to the first bonding portion is twisted, and this leads to degradation of the quality and reliability of bonding.

However, in this embodiment, the slant surface portion 15 is formed at the distal end of the lead 11, and the wire 14 is secondarily bonded to the slant surface portion 15, which means that the posture of the stem 1 need not be changed. As a result, it is possible to effect appropriate bonding while improving the productivity.

The following is a description of a wire bonding operation carried out for the light-receiving element 7 and the lead 11 in accordance with this embodiment.

A wire bonding apparatus 19 which is used in this operation is arranged as shown in FIG. 13. More specifically, the apparatus 19 performs wire bonding with respect to support jigs (described later) which are sent out one by one from a full cartridge 20A in a loader section to a transport passage 22 by the action of a pusher 21. A support jig fed onto the transport passage 22 is caught by a plurality of nibs 23a provided on a transport mechanism 23 and thereby intermittently transported on the stage 24, on which wire bonding is effected with respect to all the stems 1 which are fitted in each support jig at equal distances. The wire bonding is carried out by a wire bonding mechanism 25 which is disposed so that a bonding tool 26 attached to the distal end of an arm 25a faces the upper side of the stage 24. A support jig having all the stems 1 subjected to wire bonding is transported onto an unloading transport passage 27 by the transport mechanism 23. A plurality of rows of air jet bores 27a are disposed in the unloading transport passage 27 so as to define an air bearing which pneumatically sends the support jig into an empty cartridge 20B in an unloading section.

The stage 24 and the transport passages 22, 27 are laid at an angle of 7 degrees with respect to the horizontal plane so that the respective slant surfaces of the light-receiving element 7 and the slant surface portion 15 are horizontal. However, the transport passages 22 and 27 may be laid horizontally and the stage 24 alone may be inclined at 7° with respect to the horizontal plane.

As shown in FIGS. 14 and 15, the support jig 28 has a strip-shaped metallic frame 29 and retainers 31 which are respectively inserted into a row of mounting bores 30 provided along the center of the frame 29 at equal distances. Each retainer 31 has a substantially stepped disk-like configuration, and a lower small-diameter portion 32 is inserted into one of the mounting bores 30. Each bore 30 has a semicircular cross-section, and the small-diameter portion 32 has a cross-sectional configuration corresponding to that of the bore 30. Accordingly, the small-diameter portion 32 which is inserted into the mounting bore 30 is prevented from rotating, thereby allowing the retainer 31 to be positioned with a high degree of accuracy. An E-shaped stop ring 33 is attached to the small-diameter portion 32 projecting downward from the mounting bore 30, thus rigidly securing the retainer 31 to the frame 29.

Further, an accommodating portion 34 having a triangular cross-section is provided on the retainer 31. The accommodating portion 34 is disposed so as to correspond to the arrangement of the three leads 9, 10 and 11 as shown in FIG. 17. Accordingly, when the three leads of the stem 1 are inserted into the accommodating portion 34, the leads 9, 10 and 11 are respectively positioned at the vertexes of the triangular accommodating portion 34, which means that the stem 1 is highly precisely positioned with respect to the retainer 31 and hence the frame 29. The reproducibility of this positioning operation is favorably high. A permanent magnet 35 (a rare earth permanent magnet) is fitted in the vicinity of the accommodating portion 34 of the retainer 31. Accordingly, the stem 1, which has the leads 9, 10 and 11 inserted into the accommodating portion 34 and whose reverse surface is mounted on the retainer 31, is rigidly secured to the retainer 31 by means of the magnetic force from the permanent magnet 35. The magnetic force of the permanent magnet 35 is set to be so strong that, even when the stem 1 is positioned in such a manner that the plane thereof extends vertically, there is no fear of the position of the stem 1 changing with respect to the retainer 31, or there is no risk of the stem 1 coming off the retainer 31. Further, the stem 1, which is rigidly secured to the retainer 31 by means of the magnetic force from the permanent magnet 35, can readily be drawn out either a manual of automatic operation without any damage to the stem 1 and the like.

It should be noted that two rows of guide bores 36 are provided along two lateral edge portions of the frame 29 in such a manner that the guide bores 36 correspond to the mounting bores 30. The guide bores 36 are employed to feed and position the support jig 28 when it is moved on the transport passages 22, 27 and the stage 24 in the wire bonding apparatus.

Semiconductor devices which are to be subjected to a wire bonding operations are, as shown in FIG. 15, set on a support jig 28 in a state wherein caps 2 have not yet been mounted on the devices, and the support jig 28 is accommodated in the full cartridge 20A in the loader section. Support jigs 28 which are sent out one by one from the full cartridge 20A by the action of the pusher 21 is intermittently moved on the stage 24 by the operation of the transport mechanism 23.

Since the stage 24 is inclined at a predetermined angle, both the upper surface of the light-receiving element 7 and the slant surface portion 15 of the lead 11 on the stem 1 which is set on the support jig 28 are held horizontally on the stage 24 as shown in FIG. 18.

In this way, first and second bonding operations are successively carried out with respect to the upper surface of the light-receiving element 7 and the slant surface portion 15 of the lead 11, which are held horizontally. In this bonding operation, the bonding tool 26 comes into perpendicular contact with each of the first bonding surface of the light-receiving element 7 and the second bonding surface of the lead 11, thereby allowing appropriate bonding to be effected on both the first and second bonding surfaces. Since the slant surface portion 15 of the lead 11 which defines the second bonding surface is formed over the whole area of the distal end surface of the lead 11, a sufficiently wide bonding surface is ensured, so that bonding can be effected appropriately.

When all the stems 1 set on the support jig 28 have been subjected to wire bonding, the jig 28 is moved to the unloading transport passage 27 by the action of the transport mechanism 23 and is then sent into the empty cartridge 20B.

On the other hand, the operation of bonding the wire 13 which connects together the laser chip 5 and the lead 10 is carried out in a state wherein the support jig 28 is disposed vertically. More specifically, when the support jig 28 is placed horizontally, the first bonding surface of the laser chip 5 and the second bonding surface of the lead 10 are horizontal, and it is therefore possible to ensure a bonding condition which is appropriate to both the first and second bonding surfaces. At this time, the stem 1 is disposed in such a manner that the plane thereof extends vertically. However, since the stem 1 is reliably held on the support jig 28 by the action of the permanent magnet 35, there is no fear of the stem 1 coming off the jig 28 or moving loosely.

The operation of bonding the wire 13 for connecting the laser chip 5 and the lead 10 may be carried out either before or after the operation of bonding the wire 14 which connects together the light-receiving element 7 and the lead 11. In this case, it is preferable to arrange the wire bonding apparatus such that two combinations of a stage and a bonding mechanism for bonding the wires 13 and 14, respectively, are installed adjacent to each other so as to enable each support jig to be loaded and unloaded in a single operation.

[Embodiment III]

Figure 19A:
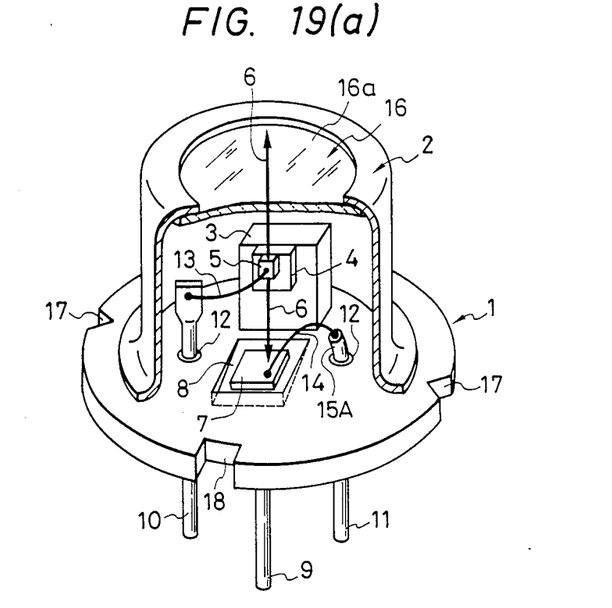
FIG. 19(a) is a partially-cutaway perspective view of a semiconductor laser device in accordance with still another embodiment of the present invention.
Figure 19B:
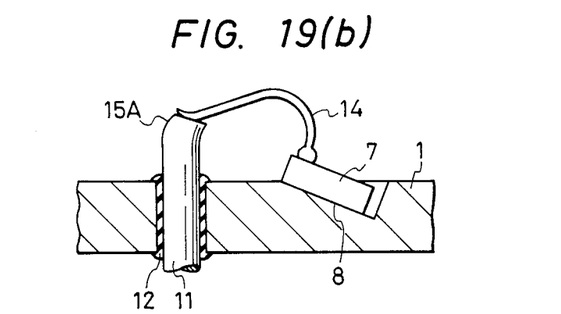
FIG. 19(b) is an enlarged schematic view of an essential part of the device shown in FIG. 19(a).

FIG. 19(a) is a partially-cutaway perspective view of still another embodiment of the present invention, and FIG. 19(b), is an enlarged schematic view of an essential part of the embodiment shown in FIG. 19(a).

The embodiment III differs from the embodiment II in that a slant surface portion 15A is defined by the distal end surface of the lead 11 to which the wire 14 electrically connected to the light-receiving element 7 is secondarily bonded, the distal end portion of the lead 11 being bent at a predetermined angle with respect to the longitudinal axis of the lead. The action and advantages obtained by this embodiment are similar to those which are offered by the embodiment II.

The above-described embodiments offer the following advantages.

(1) A slant surface portion is formed at the distal end of a lead so that the wire bonding surface of the lead defined by the slant surface portion and the wire bonding surface of the light-receiving element are parallel with each other. Accordingly, it is possible to place both the bonding surfaces horizontally at the same time by appropriately tilting the stem, and therefore the bonding tool which moves vertically can be brought into perpendicular contact with each of the bonding surfaces. As a result, both the bonding surfaces can be subjected to appropriate wire bonding.

(2) Placing both the bonding surfaces horizontally at the same time eliminates the need to tilt the bonding stage during the movement of the bonding tool from the first bonding position to the second bonding position, which means that it is possible to suppress complication of the mechanism of the wire bonding apparatus. In addition, it is possible to prevent lowering of the operability in wire bonding and avoid twisting of the wire. As a result, lowering of productivity can be prevented.

(3) By forming a slant surface portion over the whole area of the distal end of a lead, the wire bonding surface which is defined by the slant surface can be enlarged, so that it is possible to further ensure an appropriate bonding condition.

Although the invention accomplished by the present inventors has practically been described by way of embodiments, the present invention is not necessarily limitative to the described embodiments and various changes and modifications may, of course, be imparted thereto without departing from the scope and spirit of the invention.

For example, the configuration of leads are not necessarily limited to the described round rod shape and may have a square rod shape.

The wire bonding operation in which the stem is set on a support jig is not necessarily limitative, and the stem may be subjected to wire bonding alone without using a support jig.

There is, of course, no restriction on the type of wire bonding apparatus employed.

Although the invention accomplished by the present inventors has mainly been described above by way of example in which the invention is applied to a semiconductor laser device which is the background art of the invention, it is not necessarily limited to the semiconductor laser device and may widely be applied to general electronic devices having wire bonding surfaces which are inclined with respect to each other.

The following is a brief description of the advantage obtained by a representative one of the novel techniques disclosed in this application.

The distal end surface of a lead is formed so that the wire bonding surface thereof is parallel with that of a light-receiving element, whereby both the bonding surfaces can be placed horizontally at the same time. It is therefore possible to bring a bonding tool into perpendicular contact with each of the bonding surfaces, so that it is possible to effect bonding which is appropriate to both the bonding surfaces.

What is claimed is:

1. In an optoelectronics device having a stem, a light-receiving element which serves as a monitor light receiver, and a semiconductor laser having a light emitting surface parallel with a surface of the stem which generates a laser beam, said light-receiving element having a light-receiving surface inclined at an acute angle with respect to the light-emitting surface of said semiconductor laser and the surface of the stem for measuring an output power of a beam of light emitted from said semiconductor laser, the improvement comprising a bonding surface of said light-receiving element inclined at the acute angle relative to the surface of the stem, and a lead extending through the stem and having at an end thereof a bonding surface adapted to be electrically connected to said light-receiving element, wherein said bonding surface of said light-receiving element and the bonding surface of the lead are parallel with each other and at the acute angle to the surface of the stem so that a bonding tool can be brought into perpendicular contact with both bonding surfaces and a wire to be bonded thereto.

2. An optoelectronics device according to claim 1, wherein the bonding surface of said lead is a conical portion formed at the end of said lead.

3. An optoelectronics device according to claim 1, wherein the bonding surface of said lead is a circular cone portion formed at the end of said lead.

4. An optoelectronics device according to claim 1, wherein the bonding surface of said lead is a pyramidal portion formed at the end of said lead.

5. An optoelectronics device according to claim 1, wherein the bonding surface of said lead is a frusto-conical portion formed at the end of said lead.

6. In an optoelectronics device having a stem, a light-receiving element which serves as a monitor light receiver, and a semiconductor laser having a light-emitting surface parallel with a surface of the stem for generating a laser beam, the improvement comprising a bonding surface of said light-receiving element inclined at an acute angle relative to the surface of the stem, and a lead extending through the stem and having at an thereof a bonding surface adapted to be electrically connected to said light-receiving element, wherein said bonding surface of said light-receiving element and the bonding surface of the lead are parallel with each other and at the acute angle to the surface of the stem so that a bonding tool can be brought into perpendicular contact with both bonding surfaces and a wire to be bonded thereto.

7. An optoelectronics device according to claim 6, wherein the bonding surface of said lead is a conical portion formed at the end of said lead.

8. In an optoelectronics device having a stem, an auto power control mechanism provided with a monitor light receiver mounted on the stem, the improvement comprising a bonding surface of said light receiver, and a lead extending through the stem and having at an end thereof a bonding surface adapted to be electrically connected to said light receiver, wherein said bonding surfaces are arranged parallel with each other and at an acute angle to a surface of the stem so that a bonding tool can be brought into perpendicular contact with said bonding surfaces and a wire to be bonded thereto.

9. An optoelectronics device according to claim 8, wherein the bonding surface of said lead is a conical portion formed at the end of said lead.

10. An optoelectronics device comprising a stem, a light-receiving element mounted at an acute angle to a surface of the stem, a lead adapted to be electrically connected to the light-receiving element, said lead and said light-receiving element having bonding surfaces arranged parallel with each other and at the acute angle to the surface of the stem upon which the light-receiving element is mounted.

11. An optoelectronics device according to claim 10, wherein the bonding surface of said lead is a conical portion formed at the end of said lead.

12. An optoelectronics device according to claim 11, wherein said conical portion has the shape of a circular cone.

13. An optoelectronics device according to claim 11, wherein said conical portion has a pyramidal shape.

14. An optoelectronics device according to claim 11, wherein said conical portion has a frusto-conical shape.

15. In an optoelectronics device having a stem, a light-emitting element, a light-receiving element mounted at an acute angle on a surface of the stem for receiving light emitted from said light-emitting element, a first lead associated with the stem and electronically connected to said light-emitting element, and a second lead associated with the stem and electrically connected to said light-receiving element, said light-emitting and light-receiving elements having respective bonding surfaces, the improvement comprising the bonding surface of said second lead being arranged parallel with wire bonding surface of said light-receiving element and at the acute angle to the surface of the stem.

16. An optoelectronics device comprising a stem, a light-receiving element arranged at an acute angle relative to a surface of the stem, a lead having a longitudinal axis and an end surface to which an electrical connection to the light-receiving element is to be bonded, said end surface being parallel with a bonding surface of said light-receiving element and constituting a surface portion which is slanted with respect to the longitudinal axis of said lead.

17. An optoelectronics device comprising, a stem, a light-receiving element arranged at an acute angle relative to a surface of the stem, a lead having a longitudinal axis and an end surface to which an electric connection to the light-receiving element is to e bonded, said end surface being parallel with a bonding surface of said light-receiving element and constituting a slant surface portion which is formed by bending an end portion of said lead.

18. An optoelectronics device comprising a stem, a light-emitting element, a light-receiving element for receiving the light emitted from said light-emitting element arranged at an acute angle to a surface of the stem, a first lead electrically connected to said light-emitting element, and a second lead having a longitudinal axis and electrically connected to said light-receiving element, said light-emitting and light-receiving elements having respective bonding surfaces, and said second lead having an end surface which intersects the longitudinal axis of said second lead and which is parallel with the bonding surface of said light-receiving element.

19. An optoelectronics device according to claim 18, wherein said end surface of said second lead has a circular cross-section.

20. An optoelectronics device according to claim 18, wherein said end surface of said second lead has an elliptical cross-section.

* * * * *